| United States Patent [19] | [11] Patent Number: 4,780,575 |
| Flavin et al. | [45] Date of Patent: Oct. 25, 1988 |

[54] ELECTRICALLY CONDUCTIVE ELASTOMER COMPOSITION

[76] Inventors: John W. Flavin, 1006 N. Nopal St.; John E. White, 370 Mountain Dr., both of Santa Barbara, Calif. 93103; Leslie J. Reading, 748A Cieneguiatas, Santa Barbara, Calif. 93110

[21] Appl. No.: 49,680

[22] Filed: May 14, 1987

[51] Int. Cl.$^4$ .......................... H05K 9/00; H01B 1/06
[52] U.S. Cl. .............................. 174/35 GC; 252/513; 428/288; 428/379; 523/137; 524/440

[58] Field of Search ........................ 252/513; 523/137; 524/440; 174/35 GC; 339/DIG. 3; 428/288, 294, 295, 379, 372, 922, 457, 462, 465; 219/10.55 D

[56] References Cited

U.S. PATENT DOCUMENTS

| 4,634,623 | 1/1987 | Watkins | 252/513 |
| 4,664,971 | 5/1987 | Soens | 428/288 |
| 4,678,602 | 7/1987 | Tanaka et al. | 252/513 |
| 4,678,716 | 7/1987 | Tzeng | 252/513 |
| 4,678,863 | 7/1987 | Reese et al. | 252/514 |

*Primary Examiner*—Josephine Barr
*Attorney, Agent, or Firm*—Kenneth J. Hovet

[57] ABSTRACT

A rubber composition containing nickel fibers. The composition is electrically conductive and is useful for dissipating electromagnetic interference.

9 Claims, No Drawings

ELECTRICALLY CONDUCTIVE ELASTOMER COMPOSITION

BACKGROUND OF THE INVENTION

1. Field of the Invention

The present invention relates to elastomeric matrixes containing fibers and, more particularly, to electrically conductive gasket compositions.

2. Description of the Prior Art

A disadvantage of resilient plastic compositions which are suitable for use as gaskets is that they are transparent to electromagnetic interference (EMI). To remedy this problem, electrically conductive materials have been incorporated into the gasket compositions to shield against EMI. Representative prior art conductive materials comprise powders, flakes and fibers of carbon-graphite including metal coatings of aluminum, copper, steel and silver on the above.

A problem with many of the above materials is that their use within a plastic composition adversely affects the physical properties thereof. This is a particular problem in environmental gasket applications where the ability to seal against mechanical parts is a basic requirement. However, use of metallic powders in electrically conductive concentrations generally makes the plastic composition hard and ineffective as a seal. The addition of plasticizers or other modifiers may be helpful, but add to the cost and processing expense.

With metal coated fibers, the coating cracks during mixing, molding or use of the gasket. EMI shielding thereby drops precipitously. A particular problem with metal coated fibers of carbon-graphite with diameters less than 40 micron, is that, in addition to cracks in the coating, they are too flexible and fail to pierce the mating surface's microscopic layer of oxidation. As a result, conductivity between the gasket and associated mechanical parts is inhibited which, in turn, adversely affects shielding.

Also, the use of carbon-graphite and many other metallic materials create problems of galvanic corrosion. Such occur when the materials are electromechanically coupled, such as in a marine environment, with noncompatible mating surfaces. The products of corrosion form on the corresponding adjacent surfaces thereby inhibiting conductivity and effective shielding. The problem also occurs with chopped or cut metal coated graphite fibers. Here, the cut end of each fiber exposes the graphite. This provides a site for the above-described galvanic corrosion.

SUMMARY OF THE INVENTION

The present invention provides a composition consisting of rubber containing nickel fibers. Use of nickel fibers provides a minimum loss in flexibility, compression and elongation strength of the rubber. Also the electromotive force of the nickel provides a non-aggressive degree of galvanic corrosion against common metal surfaces such as aluminum, tin, zinc and steel. Additionally, the high magnetic permeability characteristic of nickel provides enhanced dissipation of the magnetic EMI component. Still further, an effective loading of the fibers serves to produce point to point contact between the fibers without the high concentrations typical or prior art compositions.

DESCRIPTION OF THE PREFERRED EMBODIMENTS

The nickel most useful for purposes of the invention comprise fibers of nickel formed by known rapid solidification processes. The nickel is preferably in commercially pure form (about 99.5%) as set forth in "ASM Metals Handbook" with electrical resistivity ranging between about 40 to 80 ohms-cir. mil/ft.

Nickel fiber length can range from about 0.50 to 5.00 cm with a preferred range of 1.0 to 3.2 cm. Diameter can range from about 10–50 micron with a preferred range of 15–30 micron. Fiber aspect ratios (L/D) from the above ranges vary from a minimum of 100 to a maximum of 5000 with a preferred range of about 300–2200.

With the above aspect ratios, incorporation of effective amounts of the fibers in an elastomer matrix will not detrimentally affect overall physical properties of the elastomer. Further, because nickel fibers have about twice the diameter of graphite or other similar fibers, their combined modulus of elasticity times moment of inertia factor (EI), produces a a Euler's critical buckling load which is about 20 times greater than for carbon-graphite fibers of equal length.

The EI factor for nickel ranges between $3.5 \times 10^{-8}$ and $2.2 \times 10^{-5}$ lb-in$^2$ which relates to a diameter range of 10–50 micron. This "stiffness" characteristic permits an effective number of ends of the nickel fibers to protrude beyond the gasket surface and engages the corresponding adjacent metal surface. The "stiffness" allows the fibers to scratch or penetrate the microscopic oxidation layer on the metal surface and provide greatly enhanced conductivity. The distance the fiber ends extend from the gasket surface is about less than 10% of the fiber length.

The nickel fiber "stiffness" also permits release of fiber ends immediately below the gasket surface during light flexing. Again, this enhances conductivity by increasing the number of exposed fibers above the gasket surface.

Fiber loading can range between 10–25 weight percent of the elastomer weight with a preferred range of 15–22 weight percent. The specific amount varies with the particular elastomer matrix being used, the gasket geometry and end use requirements. Generally, conductivity and shielding effectiveness diminish with less loading while the physical characteristics relating to sealing effectiveness are diminished at higher loading.

As used herein, the term "rubber" means any of numerous natural or synthetic elastic material with properties similar to those of natural rubber. For gasket applications, there must be thermal and chemical stability as well as resilience qualities for effective sealing characteristics. Generally, durometer (Shore A) hardness should range between 20 and 55 and tensile strength should be not less than about 500 psi.

For the gaskets specifically illustrated herein, silicone and polyurethane-based elastomers are deemed to be most useful. Particularly suitable are those than can be readily mixed with metal fibers and then molded and cured at room or moderately elevated temperatures.

The following specific embodiments are provided to illustrate the invention. They should not, however, be taken as a limitation thereon.

A silicone rubber produced by Dow Corning under the name Silastic E is mixed with its curing agent and combined with 5% by weight by Dow Corning Sylgard 527 and its curing agent. The elastomers may be degassed under vacuum whenever necessary. They are then mixed with nickel fibers. The fibers are produced commercially by National Standard Company and sold under the name Fibrex. Low shear mixing of the fibers in the viscous elastomer fluid is used to effect a random even distribution of the fibers throughout the fluid.

The mixture can again be degassed after adding the fibers. It is then transferred by trowelling, pouring or other means known in the art, to either one or both halves of a two-part mold. Care is taken to insure complete filling of all mold cavities. The mold halves are secured together and the elastomers are allowed to cure.

Although curing at room temperature can be completed in 24 hours, it may be desirable to use moderately elevated temperatures of 150°–200° F. to effect cure times on the order of 15–30 minutes. After curing, the molded product is removed, trimmed and then quality control tested.

Typical properties of a gasket produced by the above procedure containing 20 percent by weight of the unfilled elastomer are as follows:

TABLE I

| Durometer | 35 Shore A ± 5 |
|---|---|
| Tear Strength | 80 Die B, lb per in. |
| Elongation | 300% Die C |
| Tensile Strength | 600 psi |

The following examples illustrate electrical resistance change as a function of nickel fiber loading. The elastomer matrix is that set forth in Table I. However, other rubber materials as described hereinabove will produce substantially similar results.

TABLE II

| Ni Fiber Loading in % by weight of unloaded rubber | Electrical Resistance, ohm-cm |
|---|---|
| 15 | 0.595 |
| 16 | 0.278 |
| 17 | 0.376 |
| 18 | 0.113 |
| 19 | 0.440 |
| 20 | 0.088 |
| 21 | 0.166 |

The gasket set forth above containing 20 percent by weight of the unfilled elastomer was tested for shielding effectiveness. The following Table illustrates attenuation of EMI in decibels (a logarithmic measurement wherein 10 dB indicates 90% of EMI is dissipated, 20 dB indicates a 99% EMI dissipation, etc.).

TABLE III

| Frequency, MHz | Shielding Effectiveness, dB |
|---|---|
| 200 | 53.7 |
| 250 | 53.0 |
| 300 | 50.5 |
| 350 | 56.6 |
| 400 | 66.2 |
| 450 | 55.2 |
| 500 | 53.2 |
| 550 | 56.2 |
| 600 | 60.8 |
| 650 | 52.6 |
| 700 | 55.5 |
| 750 | 51.4 |
| 800 | 53.1 |
| 850 | 56.6 |
| 900 | 51.6 |
| 950 | 49.0 |
| 1000 | 51.7 |

It will be appreciated that EMI attenuation is, in part, directly related to electrical resistance. It, therefore, can be seen that attenuation will vary with nickel fiber loading in correlation with the relationships of TABLE II. That is, at a particular frequency, as fiber loading increases, resistance decreases and shielding effectiveness improves. Because of the nickel fiber aspect ratios along the physical properties thereof, less loading is required and such has less impact on the neat rubber mechanical properties.

It will be further understood that the nickel fibers most useful in the present invention are randomly bent and have a large variety of geometric configurations. As a result, when they are dispersed in effective amounts within the elastomer matrix, each fiber will have multiple contacts with adjacent fibers forming a greatly expanded network of electrical pathways. This, in turn, causes a higher degree of capacitive coupling for shunting EMI to adjacent grounded mating structures.

The nickel bent fiber characteristic is especially significant because it permits effective EMI shielding (20 dB and above) at high frequencies in the range of 5–20 GHz. Such high frequency effectiveness is not possible with linear nonductile prior art fibers such as graphite or metal coated graphite.

As mentioned previously, other elastomers may be used with the nickel fibers to produce comparable shielding effectiveness. The particular elastomer chosen will be dictated by the intended gasket application. For example, fluorosilicone rubber is useful where fuel and solvent resistance is desired. General Electric FRV 1106 is an example of this type of rubber. For deeply undercut or intricate gasket structures. Rhone-Poulenc Rhodorsil silicone elastomers may be used. Polyurethane elastomers from PTM&W Industries may also be used in place of the silicone materials.

We claim:

1. An electrically conductive composition comprising an elastomer matrix containing about 10 to 25 weight percent nickel fibers having an average length from about 0.5 to 5.0 cm and an average diameter between about 10 to 50 micron, said composition having a durometer hardness between about 20 and 55 and a tensile strength of not less than 500 psi.

2. The composition of claim 1 wherein said fibers are randomly dispersed throughout said rubber.

3. The composition of claim 1 wherein said fibers have a electrical resistivity between about 40–80 ohms-cir. mil/ft.

4. The composition of claim 1 wherein said fibers have an EI factor that ranges between $3.5 \times 10^{-8}$ and $2.2 \times 10^{-5}$ lb.-in.$^2$.

5. The composition of claim 4 wherein an effective number of ends of said fibers extend beyond the surface of said matrix.

6. A gasket comprising a rubber matrix containing about 10 to 25 weight percent randomly dispersed nickel fibers having an average length from about 0.5 to 5.0 cm, said fibers having an EI factor that ranges between $3.5 \times 10^{-8}$ and $2.2 \times 10^{-5}$ lb.-in.$^2$ forming electrical pathways through said matrix and beyond the gasket surface to a corresponding adjacent mechanical surface.

7. The gasket of claim 6 wherein said fibers have an aspect ratio of about 300 to 2200.

8. The gasket of claim 7 wherein said fibers have an electrical resistivity between about 40–80 ohms-cir. mil/ft.

9. The gasket of claim 7 wherein said fibers are randomly bent.

* * * * *